United States Patent
Laforet et al.

(10) Patent No.: US 10,811,531 B2
(45) Date of Patent: Oct. 20, 2020

(54) TRANSISTOR DEVICE WITH GATE RESISTOR

(71) Applicant: Infineon Technologies Austria AG, Villach (AT)

(72) Inventors: David Laforet, Villach (AT); Oliver Blank, Villach (AT); Cesar Augusto Braz, Villach (AT); Gerhard Noebauer, Villach (AT); Cedric Ouvrard, Villach (AT)

(73) Assignee: Infineon Technologies Austria AG, Villach (AT)

( * ) Notice: Subject to any disclaimer, the term of this patent is extended or adjusted under 35 U.S.C. 154(b) by 53 days.

(21) Appl. No.: 16/284,625

(22) Filed: Feb. 25, 2019

(65) Prior Publication Data
US 2019/0267487 A1    Aug. 29, 2019

(30) Foreign Application Priority Data
Feb. 26, 2018  (EP) ..................................... 18158715

(51) Int. Cl.
| H01L 29/78 | (2006.01) |
| H01L 29/06 | (2006.01) |
| H01L 29/40 | (2006.01) |
| H01L 29/423 | (2006.01) |
| H01L 29/43 | (2006.01) |
| H01L 29/66 | (2006.01) |

(52) U.S. Cl.
CPC ...... *H01L 29/7813* (2013.01); *H01L 29/0696* (2013.01); *H01L 29/407* (2013.01); *H01L 29/4238* (2013.01); *H01L 29/435* (2013.01); *H01L 29/66734* (2013.01); *H01L 29/7803* (2013.01); *H01L 29/42372* (2013.01)

(58) Field of Classification Search
CPC combination set(s) only.
See application file for complete search history.

(56) References Cited

U.S. PATENT DOCUMENTS

| 4,920,388 A | 4/1990 | Blanchard et al. |
| 6,444,511 B1 * | 9/2002 | Wu ................ H01L 21/823814 |
| | | 257/E21.634 |
| 8,558,308 B1 | 10/2013 | Blank et al. |

(Continued)

FOREIGN PATENT DOCUMENTS

| DE | 102015109545 A1 | 12/2016 |
| EP | 2602828 A1 | 6/2013 |
| EP | 3076431 A1 | 10/2016 |

*Primary Examiner* — Thao P Le
(74) *Attorney, Agent, or Firm* — Murphy, Bilak & Homiller, PLLC

(57) ABSTRACT

Disclosed is a transistor device with at least one gate electrode, a gate runner connected to the at least one gate electrode and arranged on top of a semiconductor body, and a gate pad arranged on top of the semiconductor body and electrically connected to the gate runner. The gate runner includes a first metal line, a second metal line on top of the first metal line, a first gate runner section, and at least one second gate runner section. The at least one second gate runner section is arranged between the first gate runner section and the gate pad. A cross sectional area of the second metal line in the at least one second gate runner section is less than 50% of the cross sectional area of the second metal line in the first gate runner section.

16 Claims, 8 Drawing Sheets

(56) References Cited

U.S. PATENT DOCUMENTS

| | | | |
|---|---|---|---|
| 2004/0217358 A1* | 11/2004 | Kaneko | H01L 29/7828 257/77 |
| 2005/0077569 A1* | 4/2005 | Yamashita | H01L 29/7828 257/330 |
| 2005/0167742 A1* | 8/2005 | Challa | H01L 29/66734 257/328 |
| 2008/0129706 A1* | 6/2008 | Kim | G06F 3/0412 345/174 |
| 2012/0049263 A1* | 3/2012 | Lin | H01L 29/7803 257/306 |
| 2012/0092606 A1* | 4/2012 | Tai | H01L 27/1288 349/141 |
| 2016/0020235 A1* | 1/2016 | Yamashita | H01L 27/14612 250/208.1 |
| 2017/0194316 A1 | 7/2017 | Kang et al. | |

* cited by examiner

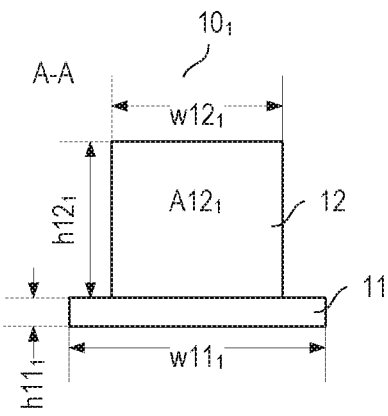
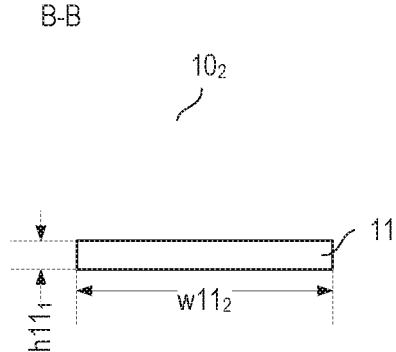
FIG 3A   FIG 3B
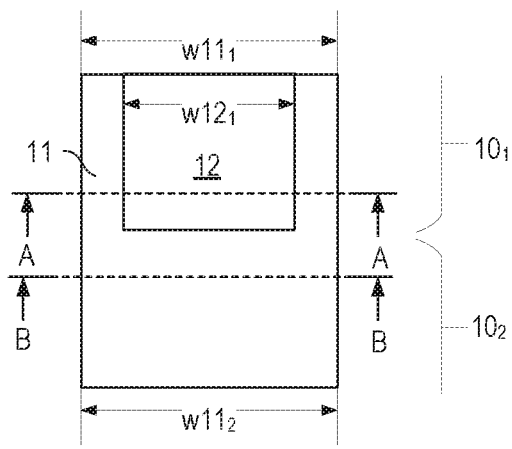
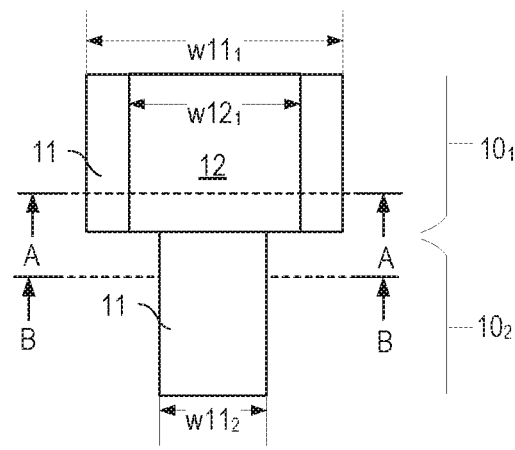
FIG 3C   FIG 4
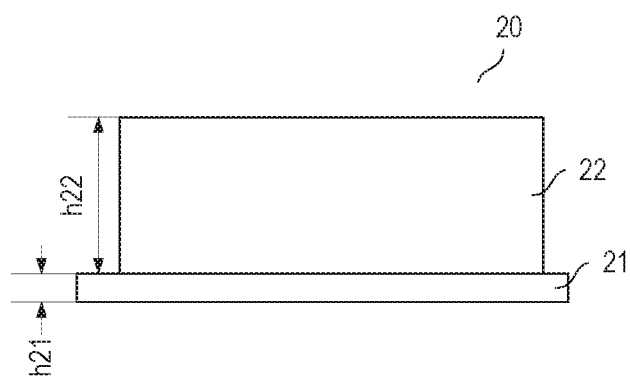
FIG 5

TRANSISTOR DEVICE WITH GATE RESISTOR

TECHNICAL FIELD

This disclosure in general relates to a transistor device, more specifically an insulated gate power transistor device.

BACKGROUND

Insulated gate power transistor devices such as power MOSFETs (Metal Oxide Semiconductor Field-Effect Transistors) or IGBTs (Insulated Gate Bipolar Transistors) are widely used as electronic switches in various types of electronic applications. An insulated gate transistor device includes a drive input and an internal capacitance between nodes of the drive input. The nodes of the drive input are usually referred to as gate node and source node, and the internal capacitance is usually referred to as gate-source capacitance. The transistor device switches on and off dependent on a charging state of the gate-source capacitance, wherein the transistor is in an on-state when the charging state is such that a voltage across the gate-source capacitance is higher than a threshold voltage of the transistor device and the transistor device is in an off-state when the voltage across the gate-source capacitance is below the threshold voltage.

A switching speed, that is, how fast the transistor device switches from the off-state to the on-state, and vice versa, is dependent on how fast the gate-source capacitance charges or discharges when the drive voltage changes. This switching speed can be adjusted by providing a resistor between the gate node and the gate-source capacitance.

It is desirable to implement this resistor in a space saving manner and such that it has an exactly predefined resistance.

SUMMARY

One example relates to a transistor device. The transistor device includes at least one gate electrode, a gate runner connected to the at least one gate electrode and arranged on top of a semiconductor body, and a gate pad arranged on top of the semiconductor body and electrically connected to the gate runner. The gate runner includes a first metal line and a second metal line on top of the first metal line and a first gate runner section and at least one second gate runner section. The at least one second gate runner section is arranged between the first gate runner section and the gate pad. Further, a cross sectional area of the second metal line in the at least one second gate runner section is less than 50% of the cross sectional area of the second metal line in the first gate runner section.

Another example relates to a method. The method includes forming a first metal layer on top of a semiconductor body, wherein the first metal layer forms a first metal line of a gate runner and a first layer of a gate pad of a transistor device, and forming a second metal layer on top of the first metal layer, wherein the second metal layer forms a second metal line of the gate runner and a second layer of the gate pad. Forming the second metal layer includes forming the second metal layer such that a cross sectional area of the second metal layer in at least one second gate runner section is less than 50% of the cross sectional area of the second metal layer in a first gate runner section, wherein the at least one second gate runner section is arranged between the first gate runner section and the gate pad.

Those skilled in the art will recognize additional features and advantages upon reading the following detailed description, and upon viewing the accompanying drawings.

BRIEF DESCRIPTION OF THE FIGURES

Examples are explained below with reference to the drawings. The drawings serve to illustrate certain principles, so that only aspects necessary for understanding these principles are illustrated. The drawings are not to scale. In the drawings the same reference characters denote like features.

FIGS. 3A-3C illustrate vertical cross sectional views and a top view of the gate runner according to another example;

FIG. 4 shows a top view of the gate runner according to yet another example;

FIG. 5 shows a vertical cross sectional view of the gate pad according to one example;

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
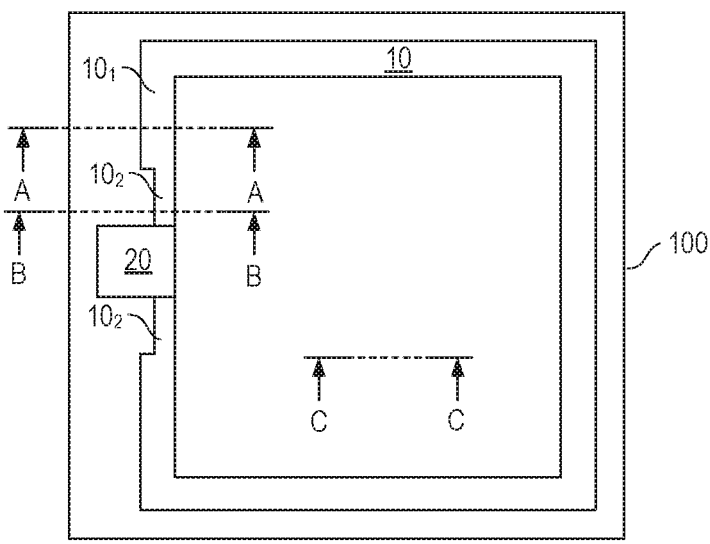
FIG. 1 schematically illustrates a top view of a transistor device that includes a gate pad and a gate runner connected to the gate pad.

FIG. 1 schematically shows a top view of one example of a transistor device. The transistor device includes a semiconductor body 100 and a gate runner 10 and a gate pad 20 arranged on top of the semiconductor body 100. FIG. 1 shows those sections of the semiconductor body 100 on which the gate runner 10 and the gate pad 20 are arranged. According to one example, this section represents the complete semiconductor body 100. According to another example, the semiconductor body 100 includes further sections adjoining the section illustrated in FIG. 1, but not shown in FIG. 1.

The gate runner 10 and the gate pad 20 being arranged "on top" of the semiconductor body 100 means that the gate runner 10 and the gate pad 20 are arranged above a surface of the semiconductor body 100 and does not necessarily mean that the gate pad 20 and the gate runner 10 adjoin the semiconductor body 100. Instead, additional layers such as insulation layers or metallization layers can be arranged between the surface of the semiconductor body 100 and the gate runner 10 and the gate pad 20.

The gate runner 10 includes a first section $10_1$ and at least one second section $10_2$, wherein the first section $10_1$ and the second section $10_2$ are different from each other in a way explained in further detail below. The at least one second section $10_2$ is arranged between the gate pad 20 and the first section $10_1$. In the example shown in FIG. 1, the gate runner 10 forms an open ring and adjoins the gate pad 20 on two opposite sides of the gate pad 20 such that the gate runner 10 and the gate pad form a closed ring. In this example the gate runner 1 includes two second sections $10_2$. Just for the purpose of illustration, the ring formed by the gate runner 10 and the gate pad 20 is rectangular. However, this ring may be implemented with another geometry such as elliptical or circular as well.

Figures 2A, 2B:
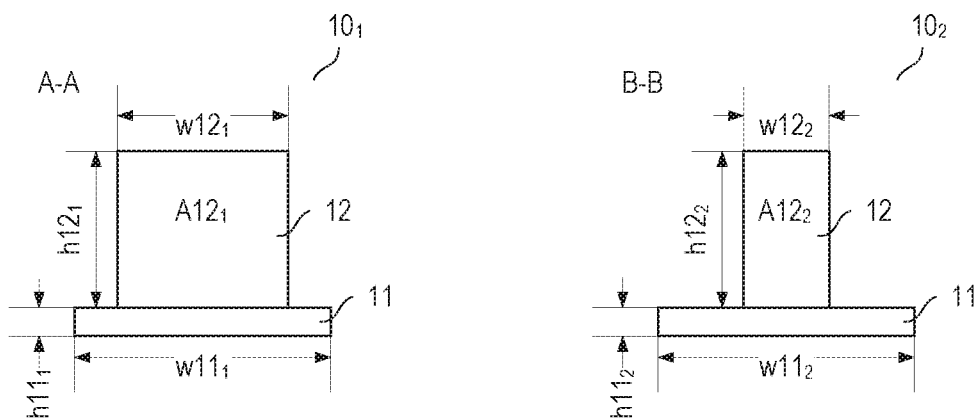
FIGS. 2A-2C illustrate vertical cross sectional views and a top view of the gate runner according to one example.
Figure 2C:
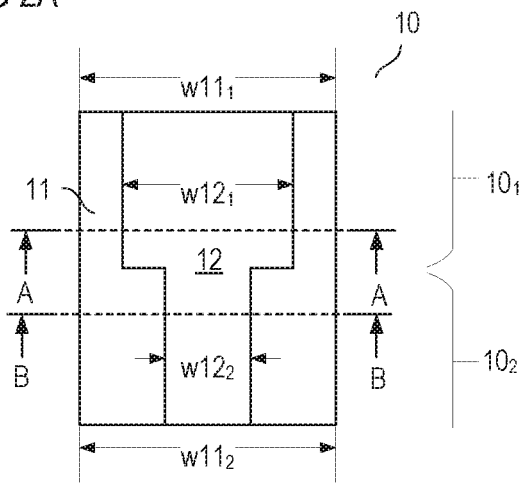

The gate runner 10, which is only schematically illustrated in FIG. 1, includes a first metal line 11 and a second metal line 12 on top of the first metal line 11. This is illustrated in FIGS. 2A to 2C. FIG. 2A shows a (vertical) cross sectional view of the first section $10_1$ of the gate runner, FIG. 2B shows a cross sectional view of the second section $10_2$ of the gate runner, and FIG. 2C shows a top view of the gate runner 10 at a transition from the first section $10_1$ to the second section $10_2$.

A cross sectional area $A12_2$ of the second metal line 12 in the second section $10_2$ is less than 50% of a cross sectional area $A12_1$ of the second metal line 12 in the first section $10_1$, $$A12_2 < 0.5 \cdot A12_1 \qquad (1).$$

According to one example, the cross sectional area $A12_2$ of the second metal line 12 in the second section $10_2$ is less than 20% of the cross sectional area $A12_1$ of the second metal line 12 in the first section $10_1$.

This may be obtained in various ways. According to one example, this is obtained by implementing the second metal line 12 with at least approximately the same height in the first section $10_1$ and the second section $10_2$, but with different widths. That is, a height $h12_1$ of the second metal line 12 in the first section $10_1$ at least approximately equals a height $h12_2$ of the metal line 12 in the second section $10_2$, and a width $w12_2$ of the second metal line 12 in the second section $10_2$ is less than 50% of a width $w12_1$ of the second metal line 12 in the first section $10_1$, that is, $$h12_2 = h12_1 \qquad (2a)$$

$$w12_2 < 0.5 \cdot w12_1 \qquad (2b).$$

Just for the purpose of illustration, in FIGS. 2A and 2B, it is assumed that the second metal line 12 has a rectangular cross section. In this case, the width is constant over the complete height of the second metal line 12. This, however, is only an example. According to another example, the metal line 12 has a shape such that the width varies over the height. For example, this is the case when the second metal line 12 has a trapezoidal shape. In this case, "the width $w12_1$ of the second metal line 12 in the first section $10_1$" means an average width of the second metal line 12 in the first section $10_1$ and "the width $w12_2$ of the second metal line 12 in the second section $10_2$" means an average width of the second metal line 12 in the second section $10_2$.

According to one example, materials of the first metal line 11 and the second metal line 12 are selected such that a resistivity of the material of the first metal line 11 is greater than a resistivity of the material of the second metal line 12. According to one example, the first metal line 11 includes tungsten (W), and the second metal line 12 includes an aluminum-copper alloy (AlCu).

FIGS. 3A to 3C show, from a gate runner 10 according to another example, vertical cross sectional views in the first section $10_1$ (see FIG. 3A) and the second section $10_2$ (see FIG. 3B) and a top view (see FIG. 3C) at a transition from the first section $10_1$ to the second section $10_2$. In this example, the cross sectional area of the second metal line 12 in the second section $10_2$ is less than 20% of the cross sectional area $A12_1$ of the second metal line 12 in the first section $10_1$ in that the second metal line 12 is omitted in the second section $10_2$. That is, the cross sectional area $A12_2$ of the second metal line 12 in the second section $10_2$ is zero ($A_2=0$).

The first metal line 11 may have the same cross sectional area in the first section $10_1$ and the second section $10_2$, that is $A11_1 = A11_2$, where $A11_1$ denotes the cross sectional area in the first section $10_1$ and $A11_2$ denotes the cross sectional area in the second section. This may be obtained by implementing the first metal line 11 such that it has the same shape and dimensions in the first section $10_1$ and the second section $10_2$. That is, a height $h11_1$ of the first metal line 11 in the first section $10_1$ may at least approximately be equal a height $h11_2$ of the first meal line 11 in the second section $10_2$, and an average width $w11_1$ of the first metal line 11 in the first section $10_1$ may at least approximately be equal an average width $w11_2$ of the first metal line 11 in the second section $10_2$, $$h11_2 = h11_1 \qquad (3a)$$

$$w11_2 = w11_1 \qquad (3b).$$

However, implementing the first metal line 11 such that it has the same cross sectional area in the first section $10_1$ and the second section $10_2$ is only an example. According to another example, the cross sectional area of the first metal line 11 is smaller in the second section $10_2$ than in the first section $10_1$. Referring to FIG. 4, this may be obtained by implementing the first metal line 11 such that the heights $h11_1$, $h11_2$ in the first and second sections $10_1$, $10_2$ are essentially the same and the width $w11_2$ in the second section $10_2$ is smaller than the width $w11_1$ in the first section $10_1$, $$h11_2 = h11_1 \qquad (4a)$$

$$w11_2 < w11_1 \qquad (4b).$$

According to one example, the width $w11_1$ of the first metal line 11 in the first section $10_1$ is the same The at least one second section $10_2$ of the gate runner 10 forms a resistor between the gate pad 20 and the first section $10_1$ of the gate runner 10. In the example illustrated in FIG. 1 in which the gate runner includes two second sections $10_2$ a respective resistor is formed by each of these second sections $10_2$. The function of this resistor is explained in detail herein further below. A resistance $R10_2$ of the resistor formed by one second section $10_2$ is approximately given by $$R10_2 = \frac{1}{G11_2 + G12_2}, \qquad (5)$$

where $G11_2$ is the conductance of the first metal layer 11 in the second section $10_2$ between the gate pad 20 and the first section $10_1$ and $G12_2$ is the conductance of the second metal layer 12 in the second section $10_2$ between the gate pad 20 and the first section $10_1$. These conductances $G11_2$, $G12_2$ are given by $$G11_2 = \frac{A11_2}{\rho 11 \cdot l2} \quad (6a)$$

$$G12_2 = \frac{A12_2}{\rho 12 \cdot l2}, \quad (6b)$$

where $A11_2$ is the cross sectional area of the first metal line 11 in the second section $10_2$, $A12_2$ is the cross sectional area of the second metal line 12 in the second section $10_2$, $\rho 11$ is the resistivity of the material of the first metal line 11, $\rho 12$ is the resistivity of the material of the second metal line 12, and l2 is a length of the first metal line 11 in a direction from the first section $10_1$ to the gate pad 20. For the ease of explanation and illustration, equations (6a) and (6b) are based on the assumption that cross sectional areas $A11_1$, $A11_2$ are essentially constant over the complete length l2. This, however, is only an example. The cross sectional areas may vary. In this case the conductances $G11_2$, $G12_2$ can be calculated using $$G11_2 = \int_0^{l2} \frac{A11_2(l)}{\rho 11 \cdot l} dl \quad (7a)$$

$$G12_2 = \int_0^{l2} \frac{A12_2(l)}{\rho 12 \cdot l} dl. \quad (7a)$$

When, as illustrated in the example shown in FIG. 3B, the second metal line 12 is omitted in the second section $10_2$ the resistance $R10_2$ is only defined by the first metal line 11 and is given by $R10_2=1/G11_2$.

According to one example, the second section $10_2$ is implemented such that the resistance $R10_2$ is between 0.5 ohms ($\Omega$) and 50 ohms, in particular between 3 ohms and 15 ohms.

According to one example shown in FIG. 5, the gate pad 20 includes two metal layers, a first metal layer 21 and a second metal layer 22 on top of the first metal layer 21. According to one example, the first metal line 11 of the gate runner 10 and the first metal layer 21 of the gate pad 20 are made from the same material and form one contiguous metal layer. According to one example, a height h21 of the first metal layer 21 of the gate pad 20 is essentially equal the heights $h11_1$, $h11_2$ of the first metal line 11 in the first and second sections $10_1$, $10_2$. According to one example, the second metal layer 22 of the gate pad is formed from the same material as the second metal line 12 of the gate runner 10. According to one example, a height h22 of the second metal layer 22 is essentially equal to heights $h12_1$, $h12_2$ of the second metal line 12 in the first and second sections $10_1$, $10_2$.

Figure 6:
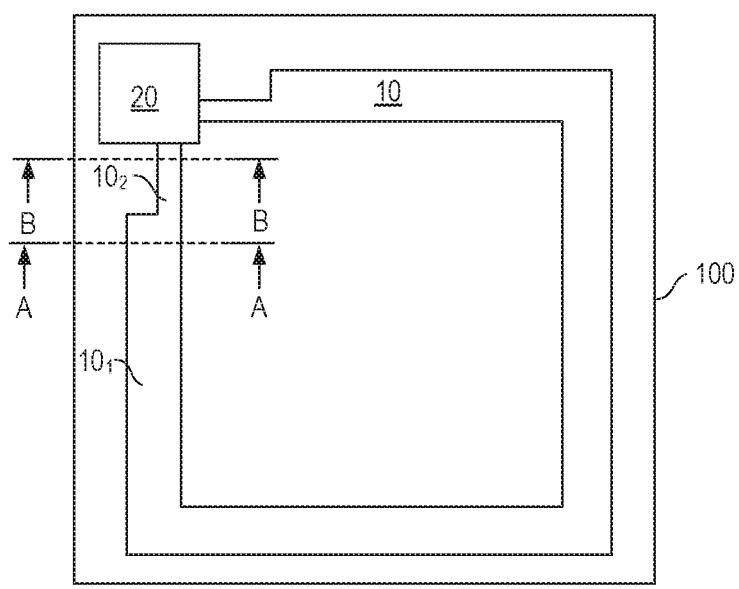
FIG. 6 shows a modification of the transistor device shown in FIG. 6.

In the example illustrated in FIG. 1, the gate runner 20 has the shape of a rectangular ring and the gate pad 20 is arranged essentially in the middle of one of four sides of this rectangular ring. This, however, is only an example. According to another example shown in FIG. 6, the gate pad 20 is located in one of the corners of the rectangular ring formed by the gate runner 10.

The transistor device further includes at least one gate electrode that is electrically connected to the gate runner 10. Examples of how the at least one gate electrode can be implemented and connected to the gate runner 10 are explained in the following.

Figure 7:
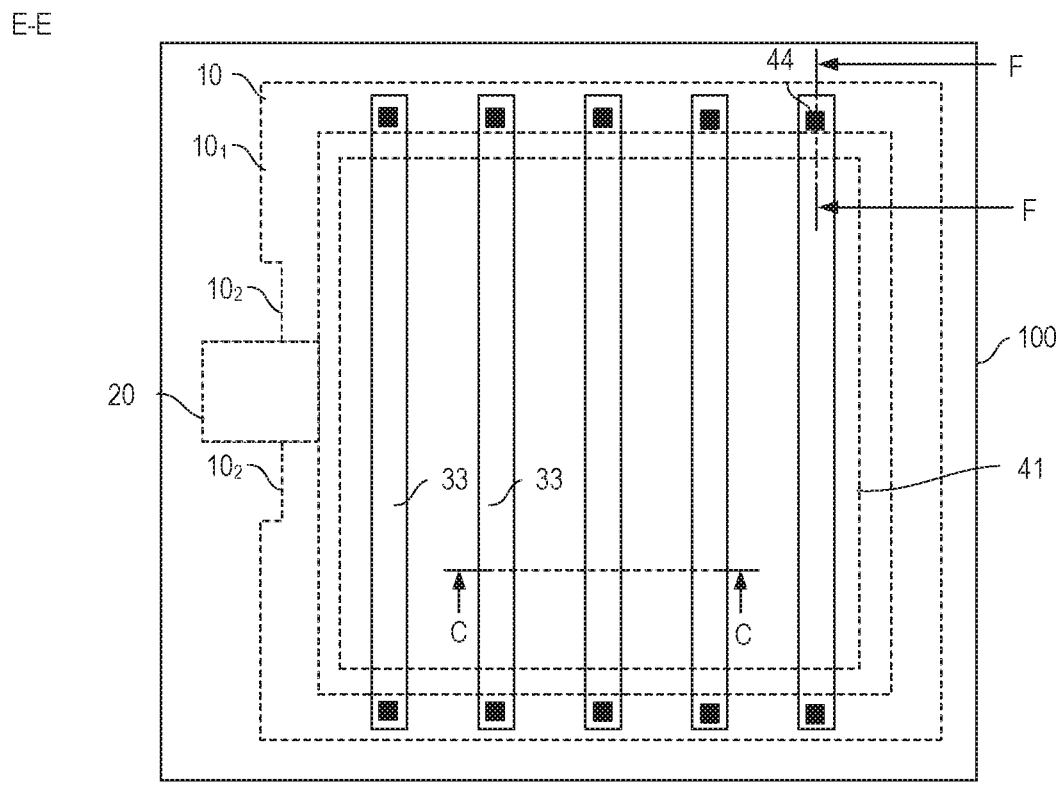
FIG. 7 shows a cross sectional view of several transistor cells according to one example.

According to an example illustrated in FIG. 7, the transistor device includes a plurality of elongated gate electrodes 33. FIG. 7 shows a horizontal cross sectional view of the semiconductor body 100 in a horizontal section plane. The position of the gate runner 10 and the gate pad 20 relative to the position of these gate electrodes 33 is illustrated in dashed lines in FIG. 7. Each of the elongated gate electrodes 33 has two longitudinal ends wherein at least one longitudinal end of each gate electrode 33 and the gate runner 10 overlap. That is, in a vertical direction, at least one longitudinal end of each of the gate electrodes 33 is located below the gate runner 10 and can be connected to the gate runner 10 via an electrically conducting plug 44. The "vertical direction" is a direction perpendicular to the horizontal section plane shown in FIG. 7.

In the example shown in FIG. 7, each of the two longitudinal ends of each gate electrode 33 and the gate runner 10 overlap and each of these longitudinal ends is connected to the gate runner 10 via an electrically conducting plug 44. Positions of these electrically conducting plugs are illustrated by black rectangles in the example shown in FIG. 7. It should be noted that FIG. 7 only illustrates the gate electrodes 33 in the semiconductor body 100. A gate dielectric dielectrically insulating from the semiconductor body 100 and active device regions of transistor cells are not shown. These features are explained herein further below.

Figure 8:
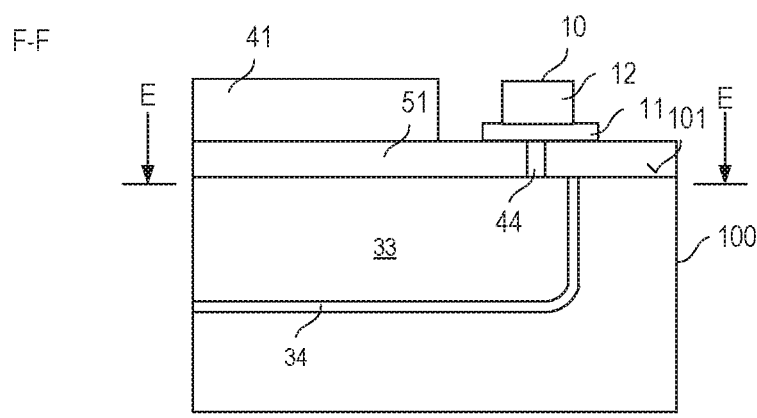
FIG. 8 shows a cross sectional view of several transistor cells according to another example.

FIG. 8 shows a vertical cross sectional view of the transistor device shown in FIG. 7 in a section plane f-f that cuts through a longitudinal end of one gate electrode 33, through one contact plug 44 and the gate runner 10. Referring to FIG. 8, the gate electrode 33 is located in a trench that extends from a first surface 101 of the semiconductor body 100 into the semiconductor body 100. The vertical direction explained with reference to FIG. 7 is a direction perpendicular to the first surface 101 of the semiconductor body 100. Inside the semiconductor body 100 the gate electrode 33 is dielectrically insulated from semiconductor material of the semiconductor body 100 by a gate dielectric 34. The semiconductor body 100 may include a conventional semiconducting material such as, for example, silicon (Si), silicon carbide (SiC), gallium arsenide (GaAs), gallium nitride (GaN), or the like.

Referring to FIG. 8, an insulation layer 51 is formed on top of the first surface 101 of the semiconductor body 100 and the gate runner 10 is formed on this insulation layer 51. The insulation layer 51 is schematically illustrated as one layer in FIG. 8, this, however, is only an example. This insulation layer 51 may include several sublayers. Further, metallization layers may be formed in this insulation layer 51. The contact plug 44 is arranged in a wire that extends from the gate electrode 33 in the vertical direction to the first metal line 11 of the gate runner 10 in order to connect the gate electrode 33 to the gate runner 10.

Figure 9:
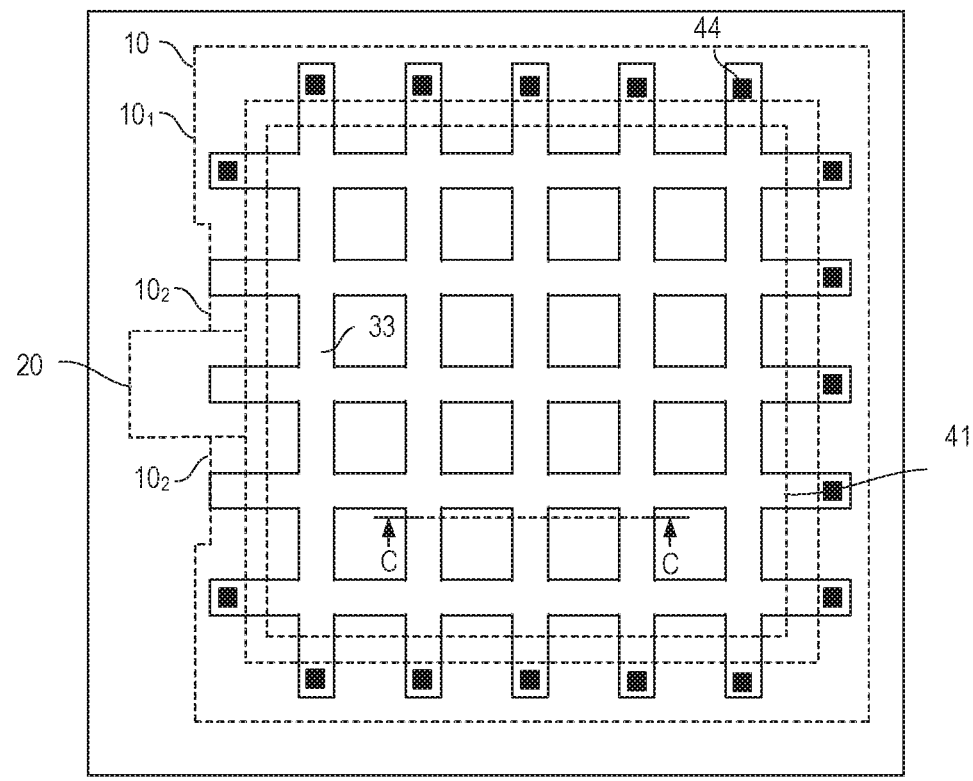
FIG. 9 shows a cross sectional view of a transistor device with several elongated gate electrodes.

FIG. 9 illustrates a transistor device according to another example. In this example, the transistor device includes only one gate electrode 33 that has the shape of a grid and a plurality of longitudinal ends. In this example, the gate runner 10 and the gate pad 20 overlap each of these longitudinal ends, that is, each of the longitudinal ends is located either below the gate runner 10 or the gate pad 20. In the example shown in FIG. 9, only longitudinal ends of the gate electrode 33 that are overlapped by the first section $10_1$ of the gate runner 10 are connected to the gate runner 10. That is, those longitudinal ends that are overlapped by the gate pad 20 and by second sections 10₂ of the gate runner 10 are not directly connected to the gate runner 10. "Not directly connected" means that there is no contact plug between the longitudinal end and the gate runner 10. However, these longitudinal ends are indirectly connected to the gate runner via sections of the gate electrode 33 and other longitudinal ends.

Figure 10:
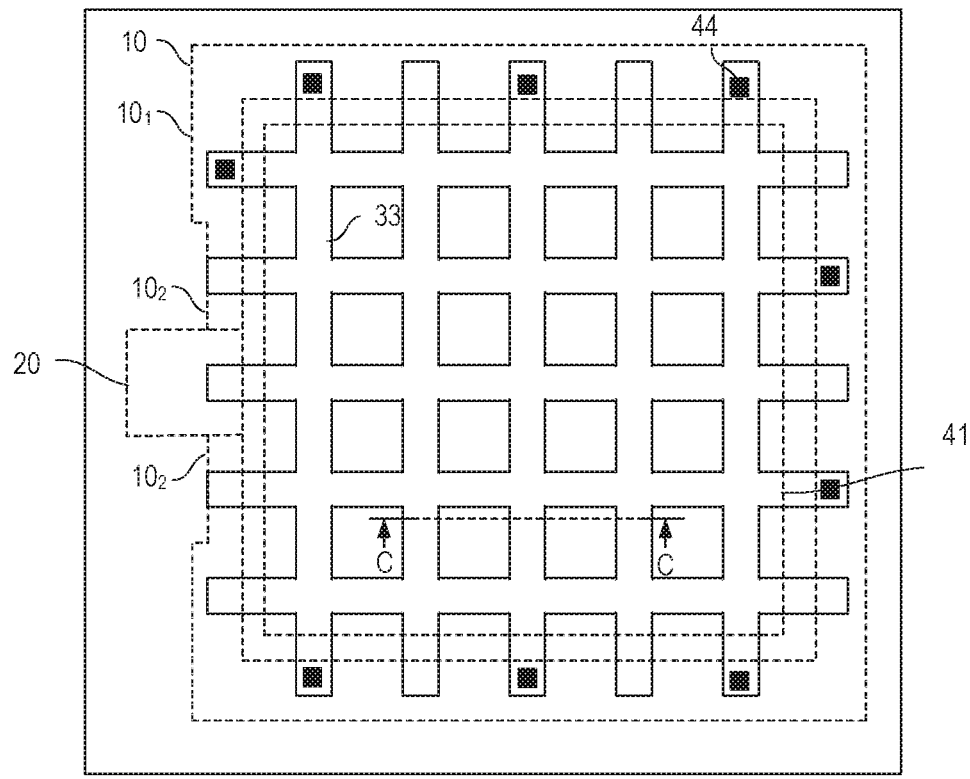
FIG. 10 shows a cross sectional view of a gate electrode and a via connecting the gate electrode to the gate runner.

According to another example illustrated in FIG. 10, only some of the longitudinal ends that are overlapped by the first section 10₁ of the gate runner 10 are directly connected to the gate runner 10 by contact plugs 44. In the example shown in FIG. 10, only every second longitudinal end is connected to the gate runner 10. This, however, is only an example.

Figure 11:
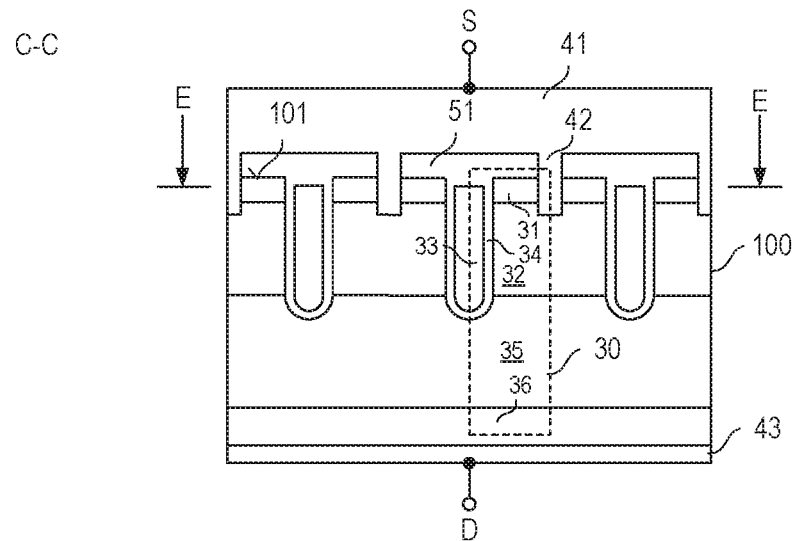
FIG. 11 shows a cross sectional view of a transistor device with one grid-shaped gate electrode.

The at least one gate electrode 33 adjoins or is part of at least one transistor cell of the transistor device. Examples of such transistor cells are illustrated in FIGS. 10 and 11. Each of these figures shows a vertical cross sectional view of the transistor device in any of the section planes C-C illustrated in FIGS. 8 to 10. In each of these figures several transistor cells 30 are shown.

Referring to FIGS. 11 to 13B, each transistor cell 30 includes a source region 31, a body region 32, a drift region 35, and a drain region 36, wherein the body region 32 separates the drift region 35 from the source region 31. Further, each transistor cell 30 includes a section of the at least one gate electrode 33, and the body region 32 is adjacent this section of the gate electrode 33 and dielectrically insulated from the gate electrode 33 by a gate dielectric 34. In a conventional fashion, the at least one gate electrode 33 serves to control a conducting channel in the body region 32 between the source region 31 and the drift region 35.

The source region 31 and the body region 32 of each transistor cell 30 are electrically connected to a metallization 41 that forms a source node S of the transistor device or that is electrically connected to the source node S. This metallization 41 may also be referred to as source metallization. The at least one gate electrode 33 is dielectrically insulated from the source metallization 41 by an insulation layer 51, which may be the same insulation layer on top of which the gate runner 10 (not shown in FIGS. 11 and 12) is arranged (see, FIG. 8). The source metallization 41 is electrically connected to the source region 31 and the body region 32 via a contact plug 42. This contact plug 42 is electrically (ohmically) connected to the source region 31 and the body region 32.

Referring to FIGS. 11 to 13B, the drift region 35 and the drain region 36 of each transistor cell 30 may be formed by semiconductor regions that are common to the individual transistor cells. The drain region 36 may adjoin a further metallization 43. This further metallization forms or is connected to a drain node D and may be referred to as drain metallization. In the examples illustrated in FIGS. 11 and 12, the source metallization 41 and the drain metallization are arranged on opposite sides of the semiconductor body 100.

Figure 12:
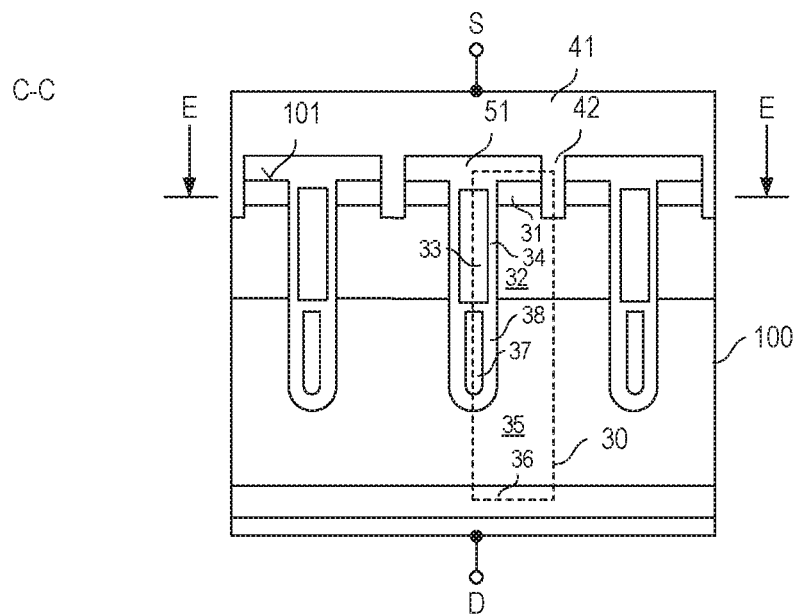
FIG. 12 shows a modification of the transistor device shown in FIG. 11.
Figure 13A:
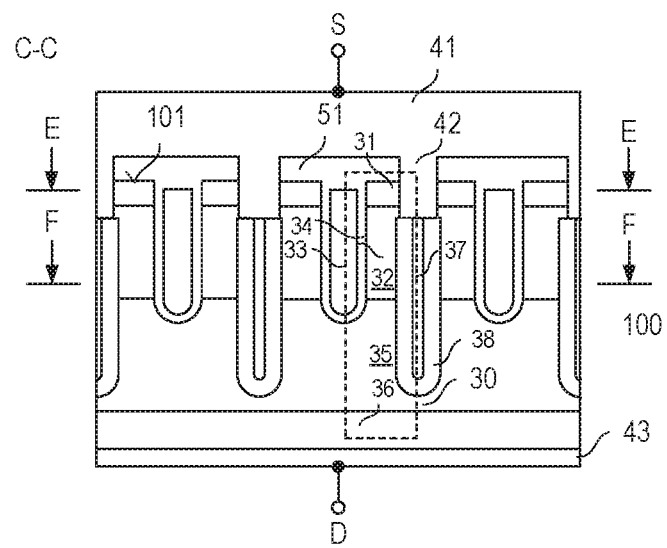
FIGS. 13A and 13B show a transistor device according to another example.
Figure 13B:
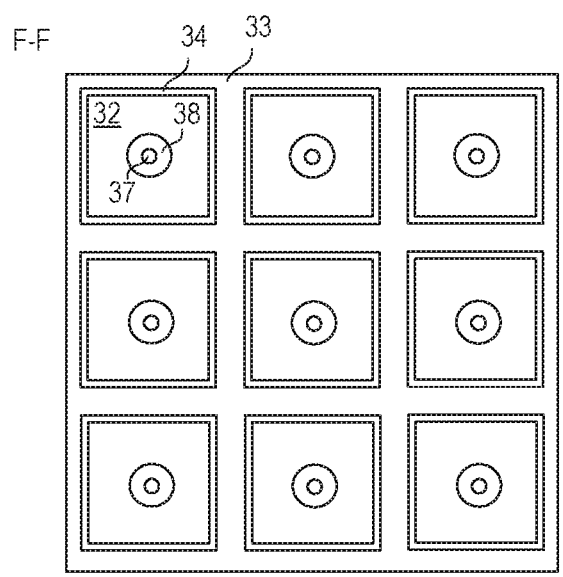

The transistor cells 30 shown in FIGS. 12 and 13A-13B are different from the transistor cells shown in FIG. 11 in that they additionally include a field electrode 37 adjacent the drift region 35 and a field electrode dielectric 38 dielectrically insulating the field electrode 37 from the drift region 35. According to one example, the field electrode 37 is electrically connected to the source metallization 41 or the source node S.

In the example illustrated in FIG. 12, the field electrode 37 is arranged in the same trench as the gate electrode 33 below the gate electrode 33. In a horizontal plane, the field electrode 37 has the same shape as the gate electrode 33, so that the field electrode 37 is elongated when the gate electrode 33 is elongated (as illustrated in FIG. 7) or grid-shaped when the gate electrode 33 is grid-shaped (as illustrated in FIGS. 9 and 10).

Further, the field electrode 37 is electrically connected to the source metallization 41 or the source node S in a vertical plane different from the one illustrated in FIG. 12. In the case of elongated gate electrodes 33 and elongated field electrodes, for example, the gate electrode 33 can be connected to the gate runner 10 at one end of the elongated trench that accommodates the gate electrode 33 and the field electrode 36, similar to what is illustrated in FIG. 10. The field electrode 37 can extend to the surface of the semiconductor body 100 and be connected to the source metallization 41 at an opposite end of the elongated trench. Alternatively, each elongated trench includes two elongated gate electrodes 33, wherein each of these gate electrodes extends to below the gate runner 10 and is connected to the gate runner 10 at a respective end of the elongated trench. In this example, the field electrode 37 can extend to the surface of the semiconductor body 100 and be connected to the source metallization 41 between the two gate electrodes, that is, at a position between the opposite ends where the gate electrodes 33 are connected to the gate runner 10.

These examples of connecting the field electrode 37 to the source metallization can be applied to a grid-shaped gate electrode 33 and a grid shaped field electrode 37 equivalently. That is, there may be ends of the grid-shaped trench where the gate electrode 33 is connected to the gate runner 10 and other ends where the field electrode 37 extends to the surface of the semiconductor body 100 and is connected to the source metallization. Alternatively, the field electrode 37 is connected to the source metallization spaced apart from the ends of the trench.

FIG. 13A shows a vertical cross sectional view of several transistor cells 30 with a field electrode 37 according to another example, and FIG. 13B shows a horizontal cross sectional view in a section plane cutting through the body regions 32. In the example shown in FIGS. 13A and 13B, the field electrode 37 of each transistor cell 30 is spaced apart from the gate electrode 33 in a lateral direction of the semiconductor body 100, which is a direction parallel to the first surface 101. Each of the field electrodes 37 is connected to a contact plug 42 of the source metallization 41, wherein the contact plug 42, like in the example illustrated in FIGS. 11 and 12 is further connected to the source and body region 31, 32 of the respective transistor cell 30.

The gate electrodes 33 of the individual transistor cells 30 can be formed by one grid-shaped electrode. This is illustrated in FIG. 13B that illustrates a horizontal cross sectional view of the transistor device in a section plane F-F shown in FIG. 13A. In this example, the field electrodes 37 are needle-shaped electrodes. Just for the purpose of illustration, these needle shaped field electrodes 37 are drawn to have a circular cross section in the example illustrated in FIG. 13B. This, however, is only an example. Other cross sections, such as rectangular or polygonal cross sections can be implemented as well.

According to another example, in a transistor device of the type shown in FIG. 13A, the gate electrodes of the transistor cells are elongated electrodes as illustrated in FIG. 9. In this example, the field electrodes 37 can be needle-shaped electrodes of the type shown in FIG. 13B or can be elongated electrodes (not shown) that are parallel to the gate electrodes 33.

In each of the transistor cells 30 shown in FIGS. 11-13B, the source region 31 and the drift region 35 are semiconductor regions of a first doping type and the body region 32 is a semiconductor region of a second doping type complementary to the first doping type. The transistor device can be implemented as an n-type transistor device or a p-type transistor device. In an n-type transistor device, the first doping type is an n-type and the second doping type is a p-type. In a p-type transistor device, the first doping type is a p-type and the second doping type is an n-type. Further, the transistor device can be implemented as a MOSFET or an IGBT. In a MOSFET, the drain region 36 has the first doping type, that is, the same doping type as the source region 31 and the drift region 35, and in an IGBT the drain region 36 has the second doping type, that is, a doping type complementary to the doping type of the source region 31 and the drift region 35.

The transistor cells 30 illustrated in FIGS. 11-13B are trench transistor cells. That is, the at least one gate electrode 33 is arranged in a trench that extends from the surface 101 of the semiconductor body 100 into the semiconductor body 100. Implementing the transistor cells 30 as trench transistor cells, however, is only one example. According to another example (not shown), the transistor cells 30 are implemented as planar transistor cells, in which the gate electrode is arranged on top of the surface 101 of the semiconductor body 100.

According to one example, the at least one gate electrode 33 includes, or is even comprised of, a metal such as, for example, tungsten (W). According to one example, the gate electrode 33 includes a titanium nitride (TiN) layer in contact with the gate dielectric 34 and a tungsten (W) layer on top of the TiN layer Using a metal provides for a very low ohmic resistance of the at least one gate electrode 33, which may be desirable for the reasons outlined below.

In the transistor device explained before, a plurality of transistor cells 30 are connected in parallel. That is, the source regions 31 of these transistor cells are connected to the source node S, the common drain region 36 is connected to the drain node D, and the at least one gate electrode 33 is connected to the gate node G. An equivalent circuit diagram of this transistor device is illustrated in FIGS. 13A-B, in which, just for the purpose of illustration, three transistor cells $30_1$, $30_2$, $30_n$ of the plurality of transistor cells are shown. Just for the purpose of illustration it is assumed that the transistor device is a MOSFET, so that in the circuit diagram shown in FIGS. 13A-B each of the transistor cells $30_1$, $30_2$, $30_n$ is represented by the circuit symbol of a MOSFET. In the circuit diagram shown in FIGS. 13A-B, the parallel connection of the individual transistor cells $30_1$-$30_n$ is represented in that source nodes $S_1$-$S_n$ of the individual transistor cells $30_1$-$30_n$ are connected to the source node S of the transistor device, drain nodes $D_1$-$D_n$ of the individual transistor cells are connected to the common drain node D. The source nodes $S_1$-$S_n$ of the individual transistor cells are formed by the source regions (31 in FIGS. 11 and 12), and the drain nodes $D_1$-$D_n$ are formed by the drain regions 36 (or the common drain region) of the transistor cells. A gate node G of the transistor device shown in FIGS. 13A-B is formed by the gate pad 20.

The transistor device may include a housing (package) in which the semiconductor body 100 is arranged. In this case, the gate pad 20, the source metallization 41 and the drain metallization 43 may be connected to terminals but are accessible from outside the housing. Such housing and terminals, however, are not illustrated in the drawings.

Figure 14:
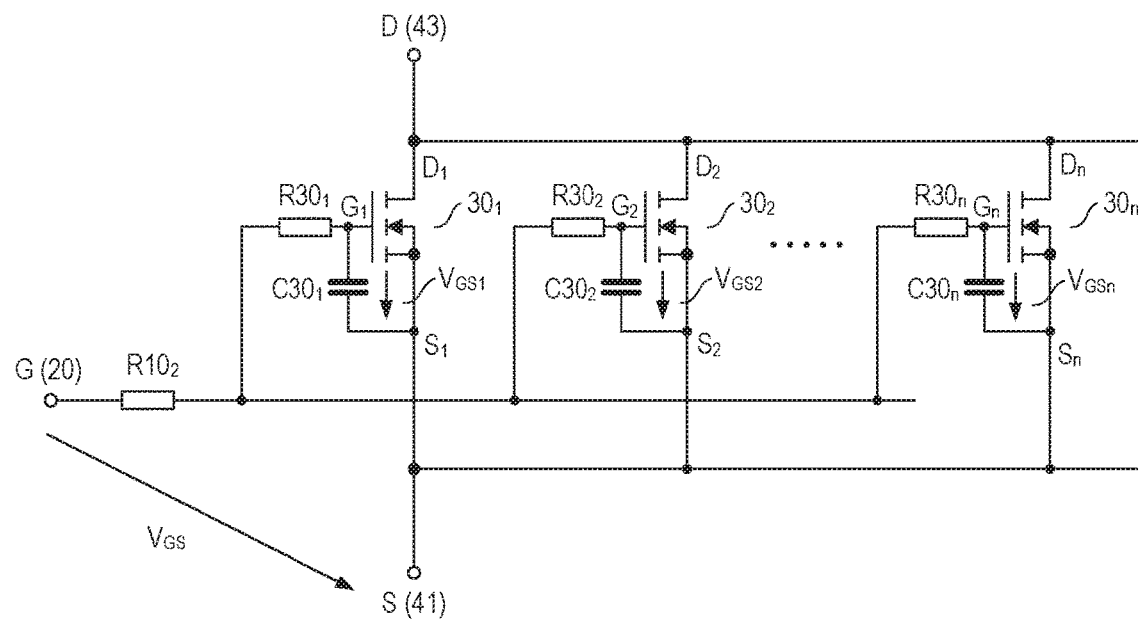
FIG. 14 shows an equivalent circuit diagram of the transistor device.

Referring to FIG. 14, each of the transistor cells $30_1$-$30_n$ includes a gate node $G_1$-$G_n$. These gate nodes $G_1$-$G_n$ are referred to as internal gate nodes in the following. These gate nodes $G_1$-$G_n$ are formed by those sections of the at least one gate electrode 33 that are adjacent the body regions (32 in FIGS. 11 and 12) of the individual transistor cells. These internal gate nodes $G_1$-$G_n$ are electrically connected to the (common) gate node G of the transistor device. An electrically conducting path between the gate node G and each of the gate nodes $G_1$-$G_n$ of the transistor cells $30_1$-$30_n$ has an electrical resistance that can be subdivided in two resistances, a first resistance $R10_2$, and a second resistance $R30_1$-$R30_n$. The first resistance $R10_2$ is formed by the at least one second section $10_2$ of the gate runner 10 and is present between the gate node G and each of the internal gate nodes $G_1$-$G_n$. The second resistance $R30_1$-$R30_n$ is formed by those sections of the gate runner 10 and the at least one gate electrode 33 that are arranged between the at least one second section $10_2$ of the gate runner 10 and the gate electrode section of the respective transistor cell $30_1$-$30_n$. These second resistances $R30_1$-$R30_n$ can be different for the individual transistor cells. Basically, the longer a distance between the second gate runner section $10_2$ and the internal gate node $G_1$-$G_n$ of a respective transistor cell $30_1$-$30_n$ along the first gate runner section $10_1$ and the at least one gate electrode 33, the greater the associated second resistance $R30_1$-$R30_n$.

Referring to FIG. 14, each transistor cell $30_1$-$30_n$ has a capacitance $C30_1$-$C30_n$ between the internal gate node $G_1$-$G_n$ and the respective source node $S_1$-$S_n$. This capacitance $C30_1$-$C30_n$ is referred to as gate-source capacitance $C30_1$-$C30_n$ in the following and is represented by a capacitor connected between the internal gate node $G_1$-$G_n$ and the respective source node $S_1$-$S_n$ in FIG. 14. The transistor cells $30_1$-$30_n$ are either in an on-state, in which they are able to conduct a current between the drain node $D_1$-$D_n$ and the source node $S_1$-$S_n$, or an off-state, in which they block. The transistor cells $30_1$-$30_n$ are in the on-state or the off-state dependent on a voltage $V_{GS1}$-$V_{GSn}$ across the respective gate-source capacitance $C30_1$-$C30_n$. This voltage is referred to as gate-source voltage in the following. A transistor cell $30_1$-$30_n$ is in the on-state when its gate-source capacitance $C30_1$-$C30_n$ has been charged such that the respective gate-source voltage $V_{GS1}$-$V_{GSn}$ is higher than a threshold voltage, and the transistor cells $30_1$-$30_n$ are in the off-state when the gate-source voltage $V_{GS1}$-$V_{GSn}$ is lower than the threshold voltage. The "threshold voltage" is dependent on a specific design of the individual transistor cells $30_1$-$30_n$. According to one example, the threshold voltages of the individual transistor cells $30_1$-$30_n$ are essentially the same.

The transistor device is controlled by a drive voltage (which may also be referred to as external gate voltage) $V_{GS}$ between the gate node G and the source node S. This drive voltage $V_{GS}$ basically defines the gate-source voltages $V_{GS1}$-$V_{GSn}$ of the individual transistor cells $30_1$-$30_n$ and, therefore, the operating states of the transistor cells $30_1$-$30_n$ wherein the transistor cells $30_1$-$30_n$ are in the off-state when the drive voltage $V_{GS}$ is below the threshold voltage of the transistor cells $30_1$-$30_n$ and the transistor cells $30_1$-$30_n$ are in the on-state when the drive voltage $V_{GS}$ is above the threshold voltage of the transistor cells $30_1$-$30_n$. A voltage level of the drive voltage $V_{GS}$ that is higher than the threshold voltage is referred to as on-level and a voltage level of the drive voltage $V_{GS}$ that is lower than the threshold voltage is referred to as off-level in the following.

Inevitably, there are delay times between a time instance when the drive voltage $V_{GS}$ changes from the off-level to the on-level, or vice versa, and time instances when the operating states of the transistor cells change accordingly. These delay times are due to the resistances $R10_2$, $R30_1$-$R30_n$ between the gate node G and the internal gate nodes $G_1$-$G_n$ and the gate-source capacitances $C30_1$-$C30_n$ which have the effect of lowpass filters. In order to avoid current filamentation when the transistor device switches on or off it may be desirable for the individual transistor cells to essentially switch on or switch off at the same time. Assuming that the transistor cells $30_1$-$30_n$ essentially have the same gate-source capacitance, this can be obtained by implementing the gate runner 10 and the at least one gate electrode 33 such that the gate resistances of the individual transistor cells $30_1$-$30_n$ are essentially the same. According to one example, "essentially the same" means that each of these gate resistances deviates less than 10% or even less than 5% from an average gate resistance, that is, $$|Rg_i| \geq 0.9 \cdot Rg_{AVG} \qquad (8),$$

where $Rg_i$ denotes the gate resistance of an arbitrary one of the transistor cells $30_1$-$30_n$ and $Rg_{AVG}$ denotes the average resistance. The gate resistance $Rg_i$ of one transistor cell is given by $$Rg_i = R10_2 + R30_i \qquad (9),$$

and the average gate resistance $Rg_{AVG}$ is given by $$Rg_{AVG} = \frac{1}{n}\sum_{i=1}^{n} Rg_i = R10_2 + \frac{1}{n}\sum_{i=1}^{n} R30_i. \qquad (10)$$

Equation (1) can be met by suitably designing the second gate runner section $10_2$ in view of the resistances $R30_1$-$R30_n$ between the second gate runner section $10_2$ and the internal gate nodes $G_1$-$G_n$. This is explained by way of an example in the following.

In the example, the gate electrode 33 is a grid-shaped electrode of the type explained with reference to FIG. 9 and includes a metal such as, for example, tungsten (W). Further, a size of an active area, which is an area in which the transistor cells are integrated is 30 square millimeters ($mm^2$), so that an overall length of the gate runner 10 (which is the length around the active region from one side of the gate pad 20 to the other side of the gate pad 20) is about 22 mm ($\approx 4 \cdot \sqrt{30mm^2}$). Further, the first gate runner section $10_1$ includes a tungsten layer with a cross sectional area of 7.5 square micrometers ($\mu m^2$) as the first metal line and an aluminum-copper alloy layer with a cross sectional area of 125 square micrometers ($\mu m^2$) as the second metal line 12. In this case, resistances that are equivalent to the resistances $R30_1$-$R30_n$ explained with reference to FIG. 14 vary between about $0.15\Omega$ and $0.5\Omega$. An average of these resistances is about $0.33\Omega$ so that the individual resistances deviate up to 54% from the average resistance.

If, for example, the gate runner 10 is implemented such that the resistance $R10_2$ of the second gate runner section is $3.3\Omega$ the gate resistances $Rg_i$ of the individual transistor cells vary between $3.45\Omega$ and $3.8\Omega$ and the average gate resistance $Rg_{AVG}$ is about $3.63\Omega$ so that the individual gate resistances $Rg_i$ deviate by less than 5% from the average gate resistance. A resistance $R10_2 = 3.3\Omega$ can be obtained, for example, by implementing the gate runner 10 with two gate runner sections $10_2$ as illustrated in FIG. 1, wherein each of these second gate runner sections $10_2$, has a length $l10_2$ of about 0.9 millimeters and only includes the first metal line 11, wherein the first metal line 11 has a cross sectional area of 7.5 square micrometers ($\mu m^2$) and is comprised of tungsten (W). The "length of the second gate runner section $10_2$" is the dimension of the second gate runner section $10_2$ in a direction from the gate pad 20 to the first gate runner section $10_1$ It should be noted that, by varying the length $l10_2$ of the second gate runner section $10_2$ and the cross sectional area of the first metal line 11, the resistance $R10_2$ can be varied within a wide range so that, in particular, resistances $R10_2$ of much higher than $3.3\Omega$ can be obtained.

It should be noted that the second gate runner section $10_2$ cannot only be used to balance the gate resistances $Rg_1$-$Rg_n$ of the individual transistor cells $30_1$-$30_n$, but can also be used to adjust the switching speed of the transistor device. Basically, the switching speed decreases as the gate resistances $Rg_1$-$Rg_n$ increase, wherein such an increase of the gate resistances $Rg_1$-$Rg_n$ can be obtained by suitably designing the second gate runner section $10_2$, in particular, by suitably designing the length of the at least one second gate runner section $10_2$ and the cross sectional area of the first metal line 11.

Figures 15A, 15B:
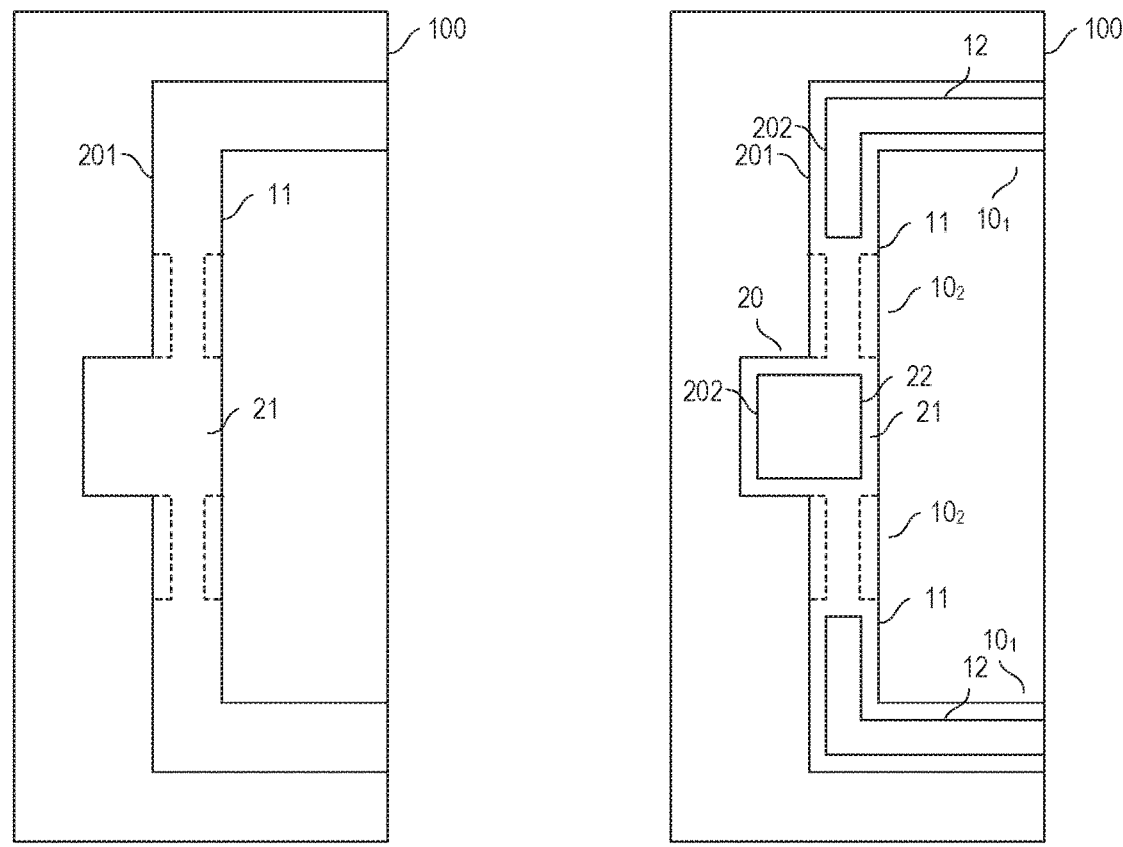
FIGS. 15A and 15B illustrate one example of a method for forming the gate pad and the gate runner.

FIGS. 15A and 15B illustrate one example of a method for forming the gate runner 10 and the gate pad 20. Each of these figures shows a top view of one section of the semiconductor body 100 during or after individual method steps.

Referring to FIG. 15A, the method includes forming a first metal layer 201 on top of the semiconductor body 100 such that the first metal layer 201 forms the first metal line 11 of the gate runner 10 and the first (metal) layer 21 of the gate pad 20. Forming the first metal layer 201 "on top of the semiconductor body 100" may include forming the first metal layer 201 on top of an insulation layer or passivation layer that is formed on the surface of the semiconductor body 100. Forming the first metal layer 201 may include a conformal deposition process.

Referring to FIG. 15B, the method further includes forming a second metal layer 202 on top of the first metal layer 201, wherein the second metal layer 202 forms the second metal line 12 of the gate runner 10 and the second (metal) layer 22 of the gate pad. Just for the purpose of illustration, in the example shown in FIG. 15B, the second metal layer 202 is produced such that it is omitted in the second gate runner section $10_2$. This, however, is only an example. In general, the second metal layer 202 is produced such that a cross sectional area of the second metal layer 202 in at least one second gate runner section $10_2$ is less than 50% of the cross sectional area of the second metal layer 202 in the first gate runner section $10_1$. In the method explained with reference to FIGS. 15A and 15B, resistances of the at least one second gate runner section $10_2$ can easily be adjusted by patterning the first metal layer 201 and the second metal layer 202.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof

What is claimed is:
1. A transistor device, comprising:
  at least one gate electrode;
  a gate runner connected to the at least one gate electrode and arranged on top of a semiconductor body; and
  a gate pad arranged on top of the semiconductor body and electrically connected to the gate runner, wherein the gate runner comprises a first metal line, a second metal line on top of the first metal line, a first gate runner section, and at least one second gate runner section, wherein the at least one second gate runner section is arranged between the first gate runner section and the gate pad, wherein a cross sectional area of the second metal line in the at least one second gate runner section is less than 50% of the cross sectional area of the second metal line in the first gate runner section.

2. The transistor device of claim 1, wherein the second metal line is omitted in the at least one second gate runner section.

3. The transistor device of claim 1, wherein a cross sectional area of the first metal line is smaller in the at least one second gate runner section than in the first gate runner section.

4. The transistor device of claim 1, wherein a height of the second metal line is approximately equal in the first gate runner section and the at least one second gate runner section.

5. The transistor device of claim 1, wherein the first metal line comprises tungsten.

6. The transistor device of claim 1, wherein the second metal line comprises an aluminum copper alloy.

7. The transistor device of claim 1, further comprising:
a plurality of transistor cells each comprising a source region and a body region integrated in the semiconductor body, wherein the body region is adjacent the at least one gate electrode and dielectrically insulated from the at least one gate electrode by a gate dielectric.

8. The transistor device of claim 1, wherein the at least one gate electrode comprises a plurality of elongated gate electrodes.

9. The transistor device of claim 1, wherein the at least one gate electrode comprises a grid-shaped gate electrode.

10. The transistor device of claim 1, wherein the at least one gate electrode comprises a metal.

11. The transistor device of claim 10, wherein the metal comprises tungsten.

12. The transistor device of claim 1, further comprising:
a plurality of contact plugs electrically connecting the at least one gate electrode to the gate runner.

13. The transistor device of claim 12, wherein the plurality of contact plugs is only connected to the first gate runner section.

14. A method, comprising:
forming a first metal layer on top of a semiconductor body, the first metal layer forming a first metal line of a gate runner and a first layer of a gate pad of a transistor device; and forming a second metal layer on top of the first metal layer, the second metal layer forming a second metal line of the gate runner and a second layer of the gate pad, wherein forming the second metal layer comprises forming the second metal layer such that a cross sectional area of the second metal layer in at least one second gate runner section is less than 50% of the cross sectional area of the second metal layer in a first gate runner section, wherein the at least one second gate runner section is arranged between the first gate runner section and the gate pad.

15. The method of claim 14, wherein forming the second metal layer such that the cross sectional area of the second metal layer in the at least one second gate runner section is less than 50% of the cross sectional area of the second metal layer in the first gate runner section comprises forming the second metal layer such that the cross sectional area of the second metal layer in the at least one second gate runner section is less than 20% of the cross sectional area of the second metal layer in the first gate runner section.

16. The method of claim 15, wherein forming the second metal layer such that the cross sectional area of the second metal layer in the at least one second gate runner section is less than 20% of the cross sectional area of the second metal layer in the first gate runner section comprises omitting the second metal layer in the second gate runner section.

* * * * *